United States Patent [19]
Crotti et al.

[11] Patent Number: 5,227,014
[45] Date of Patent: Jul. 13, 1993

[54] TAPERING OF HOLES THROUGH DIELECTRIC LAYERS FOR FORMING CONTACTS IN INTEGRATED DEVICES

[75] Inventors: Pier L. Crotti, Landriano; Nadia Iazzi, Cremona, both of Italy

[73] Assignee: SGS-Thomson Microelectronics s.r.l., Italy

[21] Appl. No.: 435,890

[22] Filed: Nov. 14, 1989

[30] Foreign Application Priority Data

Nov. 16, 1988 [IT] Italy ................ 83682 A/88

[51] Int. Cl.⁵ .......................................... H01L 21/283
[52] U.S. Cl. .................................... 156/644; 156/651; 156/657
[58] Field of Search ................ 156/643, 644, 651, 657

[56] References Cited

U.S. PATENT DOCUMENTS

| | | | |
|---|---|---|---|
| 4,656,732 | 4/1987 | Teng et al. | 156/643 |
| 4,657,628 | 4/1987 | Holloway et al. | 156/643 |
| 4,660,278 | 4/1987 | Teng | 156/643 |
| 4,707,218 | 11/1987 | Giammarco et al. | 156/643 |

FOREIGN PATENT DOCUMENTS

| | | |
|---|---|---|
| 60-58635 | 4/1985 | Japan . |
| 61-26240 | 2/1986 | Japan . |
| 62-106645 | 5/1987 | Japan . |
| 63-293946 | 11/1988 | Japan . |

Primary Examiner—W. Gary Jones
Assistant Examiner—Charles K. Friedman
Attorney, Agent, or Firm—Pollock, Vande Sande & Priddy

[57] ABSTRACT

Step coverage in contacts may be improved by forming a tapered hole through a dielectric layer by:
  a) plasma (RIE) etching through a "contact" mask the dielectric for a depth shorter than the thickness of the layer leaving a residual thickness of dielectric on the bottom of the etch;
  b) removing the residual masking material;
  c) conformally depositing a TEOS layer;
  d) etching the conformally deposited TEOS layer without a mask in (RIE) plasma until exposing the underlying silicon or polysilicon with which the contact must be established.

The anisotropic etching of the TEOS layer, conformally deposited on the partially pre-etched dielectric layer, determines a "self-aligned" exposition of the underlying silicon or polysilicon and leaves a tapered TEOS residue on the vertical pre-etched hole's walls, thus providing a desired tapering of the contact hole. Photolithographic definition is no longer a critical factor.

6 Claims, 1 Drawing Sheet

TAPERING OF HOLES THROUGH DIELECTRIC LAYERS FOR FORMING CONTACTS IN INTEGRATED DEVICES

BACKGROUND OF THE INVENTION

1. Field of the Invention

The present invention relates to a process for forming tapered holes through dielectric layers for making electrical contacts in semiconductor integrated devices. The proces is particularly useful for fabricating integrated MISFET devices.

2. Description of the Prior Art

With the reduction of dimensions of integrated devices the formation of the necessary electrical contacts with specific surface areas of the semiconducting substrate through an insulating dielectric layer becomes more and more difficult. A severe technical problem relates to the so-called "step coverage", i.e. to the more or less satisfactory ability to ensure that the metal which is deposited to fill micrometric or sub-micrometric holes etched through a dielectric layer and conformally above the surface of the latter, has the necessary continuity and uniformity of thickness and is not prone to develop fractures in particularly critical points, such as on vertical steps and over sharp edges of the surface over which the metal is deposited. In order to avoid these phenomena it is expedient to taper the contact holes, i.e. incline the vertical steps of the front profile of the cross section of the wafer on which the metal must be deposited during the fabrication process. These practices often require high resolution masking techniques as well as special aggressive anisotropic etching techniques of the dielectric through a photoresist mask, such as RIE plasma etching, in order to ensure the necessary dimensional control during the formation of such sub-micrometric structural features as contact holes.

A commonly employed technique for smoothing the rim edge of etch holes through the dielectric contemplates a thermal "reflow" of the dielectric material itself. However this treatment has the disadvantage of being necessarily carried out during the terminal steps of the process of fabrication of integrated devices and may alter the diffusion profiles of the various doping species relative to regions of the monocrystalline semiconductor substrate already critically defined in devices with a high level of miniaturization. Moreover, especially in case of particularly minuscule contacts, the reflow heat treatment of the dielectric may indeed "choke" an etched hole.

Another solution lately proposed is based upon an optical tapering technique, which contemplates the formation of a "tapered image" in the photosensitive masking layer and a strict control of the etching selectivity of the masking photoresist material and of the dielectric material for producing an inclined profile of the hole being etched through the thickness of the dielectric layer. Notwithstanding the fact that this technique has the advantage of being substantially a "cold" operation and therefore without negative effects upon the already established diffusion profiles, it requires an intrinsically low contrast photolithographic process and this is detrimental to dimensional control.

A further proposal has been of carrying out after a first partial anisotropic etching step of the dielectric, a second etching step under isotropic conditions for completing the etching of the residual thickness on the bottom of the etch hole and simultaneously causing a tapering of the top portion of the hole pre-etched through the thickness of the dielectric material layer (round etch). Also this technique has problems relating to maintaining satisfactory dimensional control.

OBJECTIVE AND SUMMARY OF THE INVENTION

It is a primary objective of the present invention to provide an improved process for forming tapered holes through a dielectric layer for forming electrical contacts in a semiconductor integrated device without the drawbacks of prior art processes.

The process object of the present invention fully meets this objective in so far it:

requires a high contrast photolithographic process, thus not penalizing in any way the dimensional control of the photolithographic definition process;

does not require particularly high resolution levels, but rather substantially reduces the criticality of the optical resolution because the definition image produced in the masking photoresist may be conveniently larger than the feature which will be reproduced in a substantially self-aligned way onto the surface of the semiconductor substrate (monocrystalline silicon) and/or of a conductor substrate (polysilicon) which must be contacted;

is substantially a cold process having no influence on already defined diffusion profiles within the semiconductor;

permits the formation of "low" contacts (i.e. on the monocrystalline silicon in source and/or drain areas) as well as "high" contacts (i.e. on the gate polysilicon) in case of integrated MISFET structures, may be carried out by employing entirely conventional definition, deposition and etching techniques, without requiring special materials and/or apparatus.

DESCRIPTION OF THE PREFERRED EMBODIMENT

Figure 1:
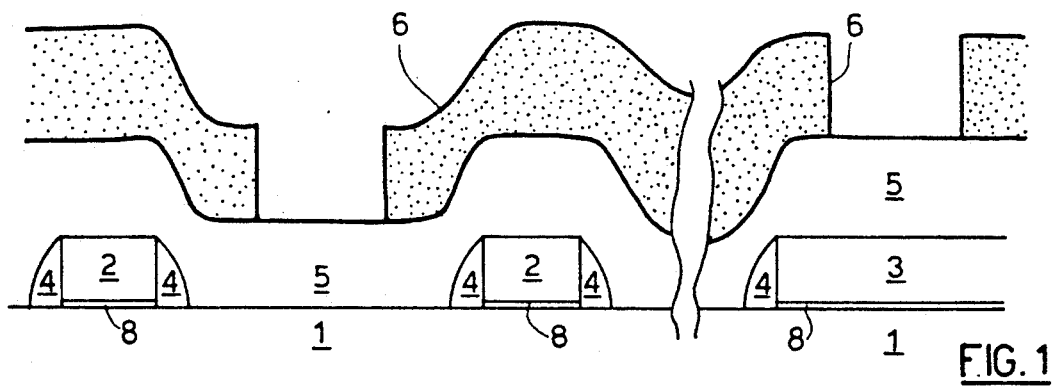
FIGS. 1 to 4 illustrate the process of the invention.

The example shown in the figures relates to the case of a semiconductor integrated MOS device wherein on a semiconducting substrate of monocrystalline silicon 1 (wherein diffused regions, not shown in the figures, have already been formed as customary) conducting gate tracks 2 of polycrystalline silicon (polysilicon) are formed, disposed in a matrix type arrangement and which are insulated from the silicon 1 by means of a dielectric gate layer 8, while other polysilicon tracks 3 are also formed in peripheral areas. All the conducting tracks 2 and 3 of a "first level" polysilicon are commonly tapered along their sides by means of dielectric spacers 4 of silicon oxide which are formed according to techniques which are well known to a skilled technician. The layer of insulating dielectric material through which contacts must be formed is indicated with 5 in the figures.

In accordance with the invention, at this point of the process of fabrication of the devices, over the surface of the front of the devices (wafers) covered by the dielectric layer 5, a photoresist mask 6 is formed, through which the contacts to be formed are photolithographically defined in a substantially noncritical way because, as it will become evident through the following description, the contacts may be defined through the photoresist mask 6 with magnified dimensions, i.e. with relatively lessened dimensional tolerances. This step is depicted in FIG. 1.

Figure 2:
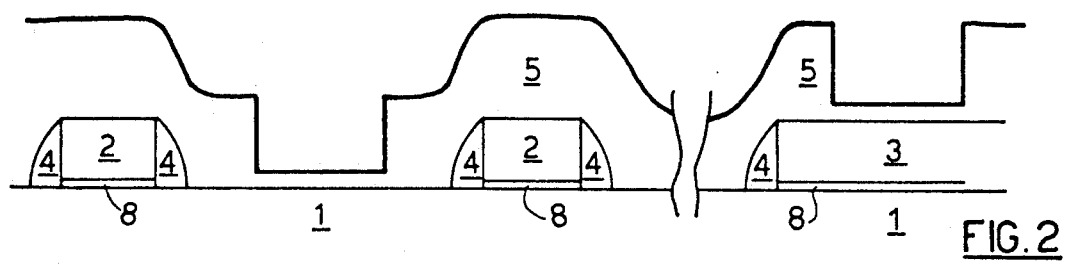

After conducting a reactive ion etching (essentially an anisotropic etching) until leaving a residual layer of about 1000-2000 Angstroms of dielectric material on the bottom of the etch holes and after removing the residual layer of masking photoresist, the section of the device is schematically depicted in FIG. 2.

A second layer 7 of dielectric material is then deposited in an essentially conformal way and with a thickness comprised between about 4500 and 6500 Angstroms. Tetra-Ethil Ortho Silicate (TEOS) is the preferred precursor material used to deposit this second dielectric layer 7.

Figure 3:
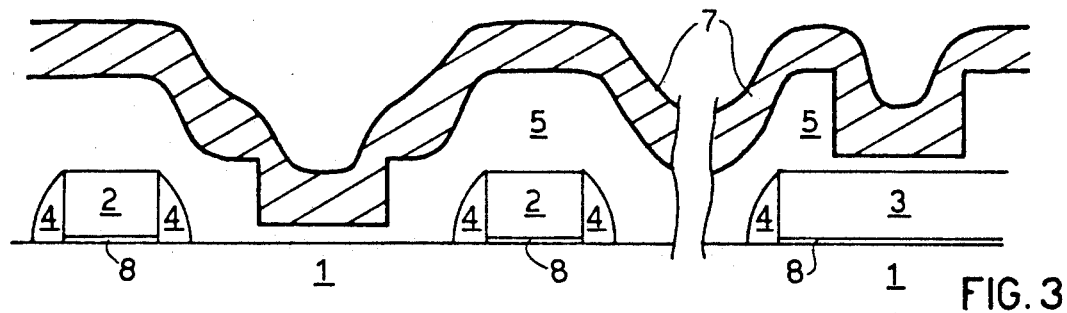

After this operation, the profile of the device is schematically depicted in FIG. 3.

Figure 4:
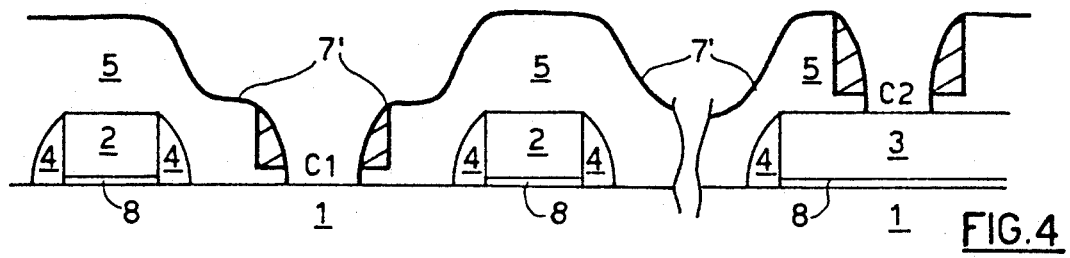

A second RIE plasma etching (substantially anisotropic etching as the first etch) of this second layer of dielectric material 7 deposited in a conformal way, is then performed and the etching is continued until etching off completely the residual layer of dielectric material 5 previously left on the bottom of the previously etched holes and until exposing the underlying monocrystalline silicon substrate 1 in the area C1 defined for a "low" contact and/or the polysilicon 3 within an area C2 defined for a "high" contact, as shown in FIG. 4. It may be easily observed from FIGS. 3 and 4 that the anisotropic etching of the silicon oxide dielectric layer 7 formed conformally on the pre-etched surface of the first dielectric layer 5 produces a desired tapering of the contact holes by leaving a residue 7' (FIG. 4) over the originally vertical walls of the pre-etched hole through the first portion of the thickness of the dielectric layer 5. Moreover the monocrystalline silicon substrate 1 as well as the polysilicon 3 are exposed within a central area which is substantially self-aligned in respect to a conveniently magnified area of definition thus lessening the criticality of the photolithographic definition of the contacts by the photoresist mask 6 (FIG. 1) through which the pre-etching of a first portion of the thickness of the insulating dielectric layer 5 is carried out (FIG. 2).

The process of the instant invention thus attains the objective and results extremely efficient and advantageous.

What we claim is:

1. A process for forming a tapered hole through a dielectric layer for making an electric contact in an integrated semiconductor device which comprises:
   a) providing a semiconducting or conducting substrate having a first dielectric layer thereon;
   b) anisotropically etching in a RIE plasma through a contact mask said first dielectric layer to thereby form a first etch hole having substantially vertical walls and wherein said etching is to a depth less than the thickness of said first dielectric, layer thereby leaving a residual thickness of dielectric material on the bottom of said first etch hole;
   c) removing the residual material of said contact mask;
   d) conformally depositing a second layer of dielectric material over said first dielectric layer and over said residual thickness of dielectric material on the bottom of said first etch hole;
   e) anisotropically etching without masking in a RIE plasma said second layer of dielectric material and said first dielectric layer beneath said second layer until exposing the surface of said semiconducting or conducting substrate at the bottom of the etch hole while leaving on said substantially vertical walls of said first etch hole through a portion of the thickness of said first dielectric layer a tapered residue of dielectric material of said conformally deposited second layer of dielectric material.

2. The process of claim 1 wherein said residual thickness of dielectric material is about 1000-2000 angstroms.

3. The process of claim 2 wherein said second layer is between about 4500 and 6500 angstroms thick.

4. The process of claim 1 which comprises depositing tetraethyl orthosilicate to form said second layer.

5. The process of claim 1 wherein said first dielectric layer is silicon oxide.

6. The process of claim 1 wherein said substrate is monocrystalline silicon.

* * * * *